United States Patent
Zhou et al.

(10) Patent No.: US 8,047,266 B2
(45) Date of Patent: Nov. 1, 2011

(54) HEAT DISSIPATION DEVICE

(75) Inventors: Shi-Wen Zhou, Shenzhen (CN); Jun Cao, Shenzhen (CN); Wei-Ping Gong, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 727 days.

(21) Appl. No.: 12/138,439

(22) Filed: Jun. 13, 2008

(65) Prior Publication Data
US 2009/0310304 A1 Dec. 17, 2009

(51) Int. Cl.
*F28F 7/00* (2006.01)
*H05K 7/20* (2006.01)

(52) U.S. Cl. .................................. 165/80.3; 165/104.21

(58) Field of Classification Search ................. 165/80.3, 165/185, 104.21, 104.33; 361/697, 700, 361/704; 257/715; 174/15.2, 16.3
See application file for complete search history.

(56) References Cited

U.S. PATENT DOCUMENTS

| | | | |
|---|---|---|---|
| 6,189,601 B1 * | 2/2001 | Goodman et al. | 165/80.3 |
| 6,779,595 B1 * | 8/2004 | Chiang | 165/104.33 |
| 7,100,681 B1 * | 9/2006 | Wu et al. | 165/104.33 |
| 7,167,364 B2 * | 1/2007 | Lopatinsky et al. | 361/697 |
| 7,188,663 B2 * | 3/2007 | Lin | 165/104.33 |
| 7,213,637 B2 * | 5/2007 | Lin et al. | 165/104.26 |
| 7,269,014 B1 * | 9/2007 | Zhao et al. | 361/700 |
| 7,331,379 B2 * | 2/2008 | Chen et al. | 165/104.33 |
| 2005/0141198 A1 * | 6/2005 | Lee et al. | 361/700 |
| 2005/0225943 A1 * | 10/2005 | Shih et al. | 361/700 |

FOREIGN PATENT DOCUMENTS

| CN | 1798496 A | | 7/2006 |
|---|---|---|---|
| JP | 2001223308 A | * | 8/2001 |

* cited by examiner

*Primary Examiner* — Tho V Duong
(74) *Attorney, Agent, or Firm* — Altis Law Group, Inc.

(57) ABSTRACT

A heat dissipation device includes a first heat sink, a second heat sink located on the first heat sink, a third heat sink located on the second heat sink, and a heat conducting member formed by bending a flat, plate-like member and connecting the first, second and third heat sinks. The heat conducting member includes a heat absorbing section contacting with the first heat sink, and first and second heat dissipating sections extending inwards from upper ends of first and second connecting sections extending upwardly from two ends of the heat absorbing section, respectively. The first heat dissipating section is sandwiched between the first and second heat sinks, and the second heat dissipating section is sandwiched between the second and third heat sinks. A width of the first and second heat dissipating sections is identical to that of the second heat sink.

12 Claims, 3 Drawing Sheets

HEAT DISSIPATION DEVICE

BACKGROUND OF THE INVENTION

1. Field of the Invention

The present invention relates generally to heat dissipation devices, and more particularly to a heat dissipation device incorporating a bent heat conducting member interconnecting a plurality of heat sinks for removing heat from a heat-generating electronic component. The heat conducting member has a plurality of flat, plate-shaped portions on which the heat sinks are mounted.

2. Description of related art

Computer electronic components, such as central processing units (CPUs), generate great amounts of heat during normal operation thereof. If the heat is not properly dissipated, it can deteriorate an operational stability of the electronic components and damage associated electronic devices. Thus the heat must be removed quickly to ensure normal operation of these electronic components. A heat dissipation device is often attached to a top surface of a CPU to remove heat therefrom.

Conventionally, the heat dissipation device includes a base, a plurality of fins arranged on the base, and a plurality of heat pipes connecting the base and the fins. A plurality of grooves is defined in the base, and a plurality of holes is defined in the fins. Each heat pipe has a bent configuration and includes an evaporating section received in a corresponding groove of the base and a condensing section extending from the evaporating section. The condensing section is inserted in a corresponding hole of the fins. A cross-sectional configuration of each of the heat pipes is round. Due to a limited contacting area between the fins and the heat pipes, connection strength and reliability of the fins and the heat pipes completed by soldering are not so good that after a long time of use, the connection may be in a risk of failure, thereby decreasing the heat dissipating efficiency of the heat dissipation device.

Additionally, to define grooves in the base and holes in the fins increases complexity of the manufacture of the heat dissipation device, which accordingly increases cost of the heat dissipation device. Moreover, due to arced configuration of the bent portions of the heat pipes, it is difficult to mount the fins to these bent portions of the heat pipes, whereby the number of the fins which can be attached to the conventional round heat pipes is limited. Thus, the heat dissipation efficiency of the heat dissipation device incorporating the conventional round heat pipes is not high.

What is needed, therefore, is an improved heat dissipation device which can overcome the above problems.

SUMMARY OF THE INVENTION

A heat dissipation device includes a first heat sink, a second heat sink located on the first heat sink, a third heat sink located on the second heat sink, and a bent heat conducting member connecting the first, second and third heat sinks. The heat conducting member includes a flat, plate-shaped heat absorbing section contacting with the first heat sink, and first and second flat, plate-shaped connecting sections extending upwardly from two opposite ends of the heat absorbing section respectively. A flat, plate-shaped first heat dissipating section extends horizontally from a top end of the first connecting section to be located over the heat absorbing section. A flat, plate-shaped second heat dissipating section extends horizontally from a top end of the second connecting section to be located over the first heat dissipating section. The first heat dissipating section is sandwiched between the first and second heat sinks, and the second heat dissipating section is sandwiched between the second and third heat sinks. A width of each of the first and second heat dissipating sections is identical to that of the second heat sink.

Other advantages and novel features of the present invention will become more apparent from the following detailed description when taken in conjunction with the accompanying drawings.

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
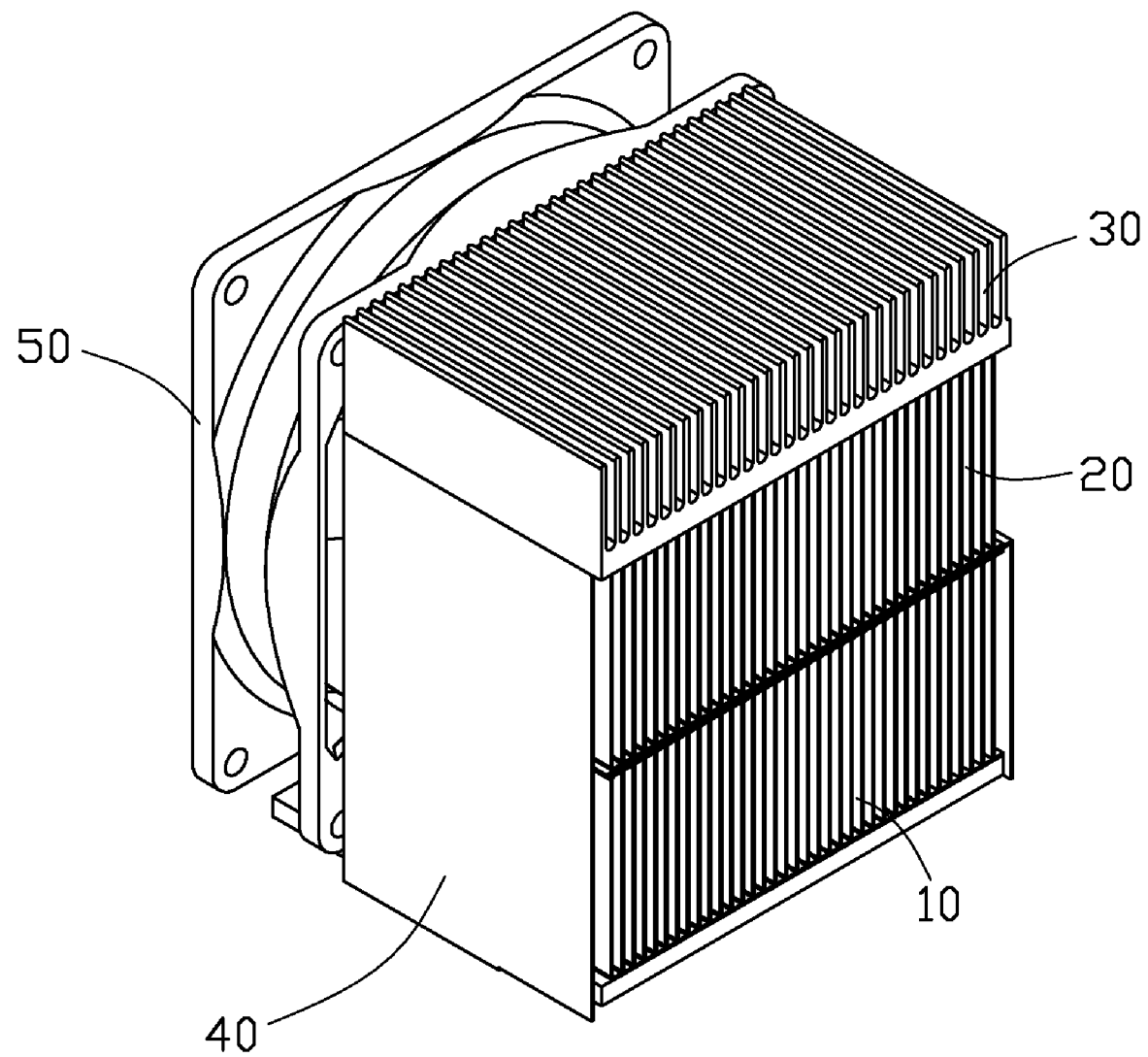
FIG. 1 is an assembled, isometric view of a heat dissipation device in accordance with a preferred embodiment of the present invention.
Figure 2:
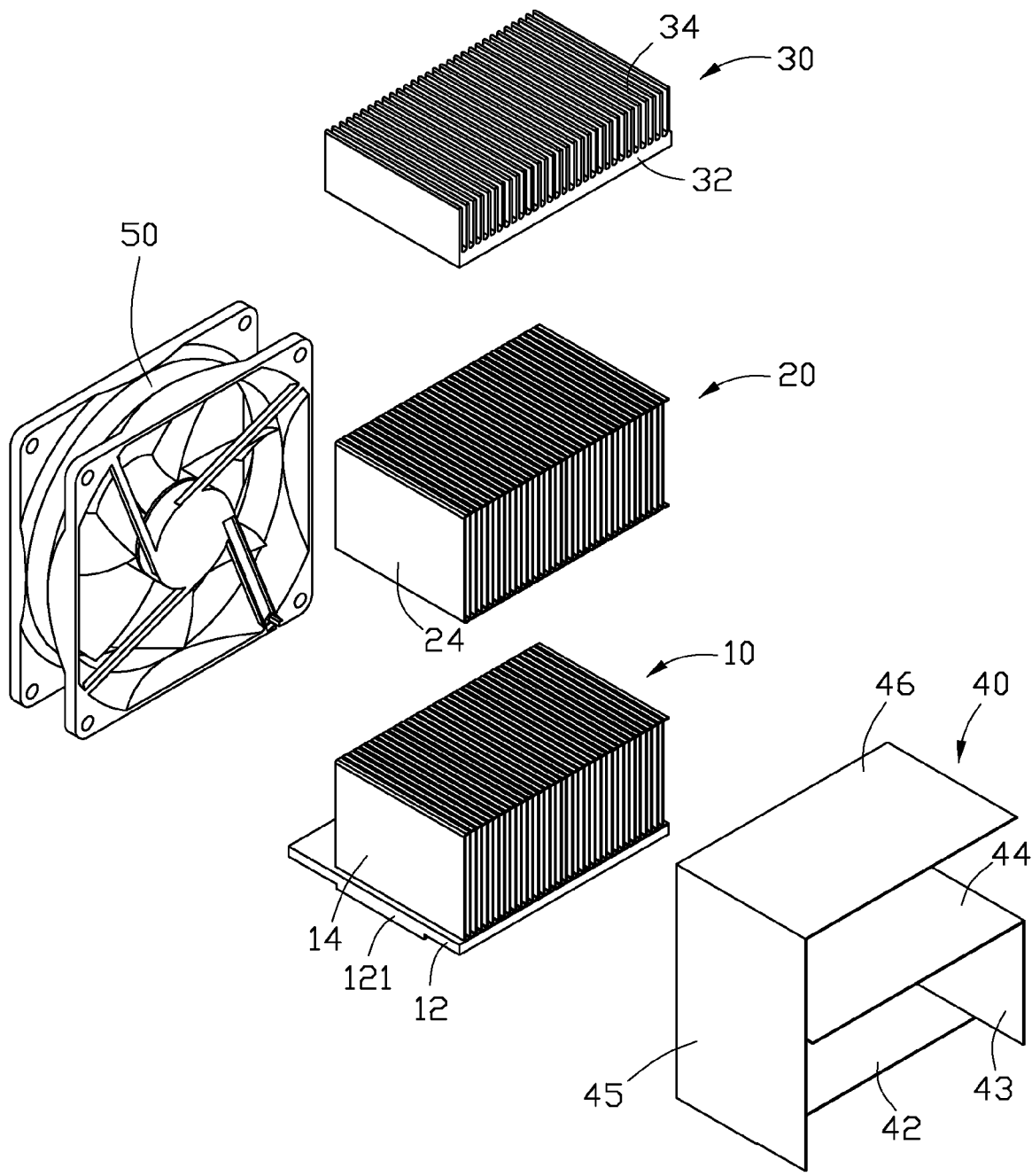
FIG. 2 is an exploded, isometric view of the heat dissipation device in FIG. 1.

Referring to FIGS. 1-2, a heat dissipation device in accordance with a preferred embodiment of the present invention comprises a first heat sink 10, a second heat sink 20 located on the first heat sink 10, a third heat sink 30 located on the second heat sink 20 and a heat conducting member 40 connecting with the first, second, third heat sinks 10, 20, 30. A fan 50 is attached to rears of the first, second, third heat sinks 10, 20, 30.

The first heat sink 10 comprises a base 12 and a plurality of fins 14 arranged on the base 12. The base 12 is substantially a rectangular plate. A bulge 121 extends downwardly from a middle portion of a bottom surface of the base 12. The fins 14 are parallel to each other and a channel (not labeled) is defined between every two adjacent fins 14. Each of the fins 14 comprises a perpendicular body (not labeled) and two flanges (not labeled) extending horizontally from bottom and upper edges of the body respectively. The bottom flanges of the fins 14 cooperatively form a flat surface to contact the base 12. The upper flanges of the fins 14 cooperatively form a flat surface to contact the heat conducting member 40. The base 12 has a width (i.e., along a front-to-rear direction thereof) larger than that of the fins 14. A rear part of the base 12 extends out of the fins 14 for accommodating the fan 50 thereon.

The second heat sink 20 comprises a plurality of fins 24. The fins 24 are parallel to each other and parallel to the fins 14 of the first heat sink 10. A channel (not labeled) is defined between every two adjacent fins 24. Each of the fins 24 has an identical configuration with the fins 14 and comprises a perpendicular body (not labeled) and two flanges (not labeled) extending horizontally from bottom and upper edges of the body respectively. The bottom flanges of the fins 24 cooperatively form a flat surface to contact the heat conducting member 40. The upper flanges of the fins 24 cooperatively form a flat surface to contact with the heat conducting member 40. A width of the fins 24 is identical to that of the fins 14.

The third heat sink 30 comprises a base 32 and a plurality of fins 34 extending upwardly from the base 32. The fins 34 are parallel to each other and parallel to the fins 14, 24. A channel (not labeled) is defined between every two adjacent fins 34. A width of the fins 34 (i.e., a width of the heat sink 30) is similar to that of the fins 14, 24.

The heat conducting member 40 is made of high heat conductivity material. In the present embodiment, the heat conducting member 40 is a thin plate made of copper or copper alloy. The heat conducting member 40 comprises a horizontal heat absorbing section 42, first and second connecting sections 43, 45 extending upwardly from two opposite ends of the heat absorbing section 42, and first and second heat dissipating sections 44, 46 extend horizontally from free ends of the first and second connecting sections 43, 45 respectively. The first and second heat dissipating sections 44, 46 extend inwards and are at different levels, where the second heat dissipation section 46 is located above the first heat dissipating section 44. The heat absorbing section 42, the first and second connecting sections 43, 45 and the first and second heat dissipating sections 44, 46 are substantially flat plates. A length of the heat absorbing section 42 is similar to that of the base 12 of the first heat sink 10. A width of the heat absorbing section 42 is identical to that of the bulge 121 of the base 12. The heat absorbing section 42 is attached to the bulge 121 of the base 12. A heat generating element (not shown), such as a CPU is attached under the heat absorbing section 42. The heat generated by the heat generating element is absorbed by the heat absorbing section 42 and is then transferred to the first, second and third heat sinks 10, 20, 30 to dissipate to environment. A width of the first, second connecting sections 43, 45 and the first, second heat dissipating sections 44, 46 is identical to that of the fins 14, 24. A height of the second connecting section 45 is larger than that of the first connecting section 43. A length of the second heat dissipating section 46 is similar to that of the third heat sink 30. The third heat sink 30 is fitly soldered on the second heat dissipating section 46.

Figure 3:
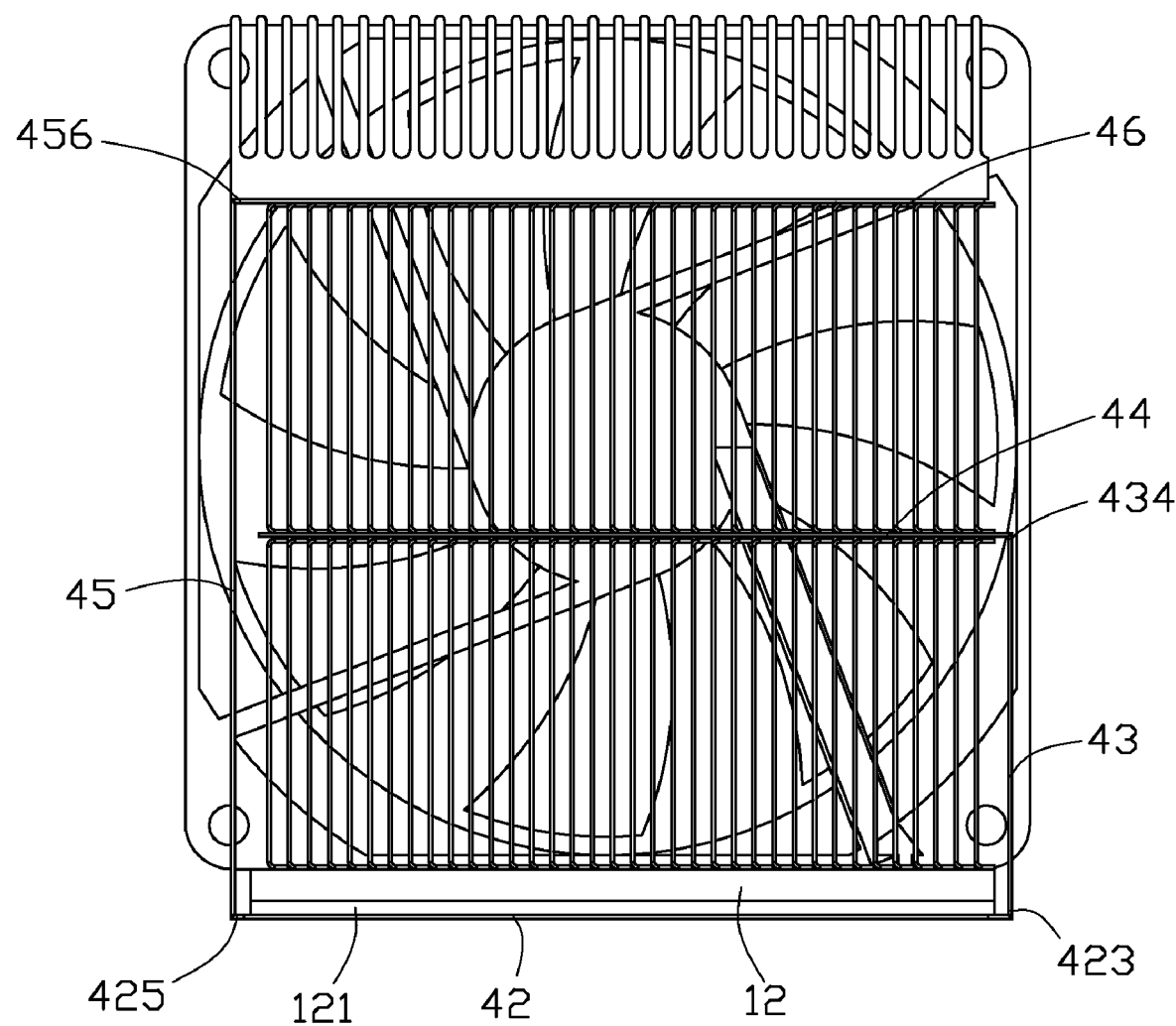
FIG. 3 is a front view of the heat dissipation device in FIG. 1.

Also referring to FIG. 3, connecting portions 423, 425, 434, 456 between the heat absorbing section 42 and the first connecting section 43, between the heat absorbing section 42 and the second connecting section 45, between the first connecting section 43 and the first heat dissipating section 44, and between the second connecting section 45 and the second heat dissipating section 46 each have an orthogonal configuration. In other words, the heat absorbing section 42 is perpendicular to the first and second connecting sections 43, 45, the first connecting section 43 is perpendicular to the first heat dissipating section 44 and the second connecting section 45 is perpendicular to the second heat dissipating section 46.

The fan 50 is arranged on the rear portion of the base 12 of the first heat sink 10 and in rear of the fins 14 of the first heat sink 10 and the second and third heat sinks 20, 30. Cooling air generated by the fan 50 can flow through the channels of the fins 14, 24, 34 to dissipate the heat in the first, second and third heat sinks 10, 20, 30.

In assembly, the first heat sink 10 is arranged on the heat absorbing section 42 of the heat conducting member 40. The second heat sink 20 is arranged on the first heat dissipating section 44 of the heat conducting member 40 and completely covers on the first heat dissipating section 44. The first heat dissipating section 44 is sandwiched between the first and second heat sinks 10, 20. The third heat sink 30 is arranged on the second heat dissipating section 46 of the heat conducting member 40 and completely covers on the second heat dissipating section 46. The second heat dissipating section 46 is sandwiched between the second and third heat sinks 20, 30. The fan 50 is at last arranged on the base 12 of the first heat sink 10 and in rear of the fins 14 of the first heat sink 10 and the second and third heat sinks 20, 30.

As the heat conducting member 40 is formed by bending a flat, plate-shaped member and a width of a corresponding heat dissipating section 44, 46 being identical to that of a corresponding second and third heat sink 20, 30, a contacting area between the second and third heat sinks 20, 30 and the heat conducting member 40 is large. Therefore, a number of the fins 24, 34 connecting with the heat conducting member 40 can have a large amount. Furthermore, since the first sink 10 also has a plurality of fins 14 thereon, the number of the fins which can be thermally connected with the heat conducting member 40 is further increased. Moreover, the connection portions 423, 425, 434, 456 between the heat absorbing section 42 and the first, second connecting section 43, 45, and between the first, second connecting section 43, 45 and the first, second heat dissipating section 44, 46 each are right-angled, the fins 14, 24, 34 can be conveniently arranged adjacent to the connection portions 423, 425, 434, 456 of the heat conducting member 40 thereby enabling the fins 14, 24, 34 to have a contacting area with the heat conducting member 40 as large as possible.

Understandably, the heat conducting member 40 can be formed by bending a vapor chamber with work fluid filled therein in an alternative embodiment.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device, comprising:
   a first heat sink;
   a second heat sink located on the first heat sink; and
   a heat conducting member formed by bending a flat, plate-shaped member and connecting the first and second heat sinks, the heat conducting member comprising;
   a heat absorbing section contacting the first heat sink and adapted for connecting with a heat-generating electronic component;
   first and second heat dissipating sections extending inwards from two ends of the heat absorbing section, respectively, wherein the first heat dissipating section is sandwiched between the first and second heat sinks, and the second heat dissipating section contacts a top of the second heat sink;
   a first connecting section interconnecting the heat absorbing section and the first heat dissipating section; and
   a second connecting section interconnecting the heat absorbing section and the second heat dissipating section;
   wherein a width of the first and second heat dissipating sections and the first and second connecting sections is identical to that of the second heat sink, and the first and second heat dissipating sections completely cover tops of the first and second heat sinks, respectively.

2. The heat dissipation device as claimed in claim 1, wherein the flat, plate-shaped member is a copper plate.

3. The heat dissipation device as claimed in claim 1, wherein the flat, plate-shaped member is a vapor chamber with a work fluid filled therein.

4. The heat dissipation device as claimed in claim 1, wherein the heat absorbing section, the first and second connecting sections and the first and second heat dissipating sections are flat plates, the heat absorbing section is perpendicular relative to the first and second connecting sections, the first connecting section is perpendicular relative to the first heat dissipating sections and the second connecting section is perpendicular relative to the second heat dissipating section.

5. The heat dissipation device as claimed in claim 1, wherein the first heat sink comprises a base and a plurality of fins parallel to each other and arranged on the base, and the second heat sink comprises a plurality of fins parallel to each other.

6. The heat dissipation device as claimed in claim 5, wherein a protrusion extends downwardly from a middle portion of the base, the protrusion contacts the heat absorbing section of the heat conducting member, and a width of the protrusion is identical to that of the heat absorbing section.

7. The heat dissipation device as claimed in claim 1, further comprising a fan located at rears of the first and second heat sinks 8. A heat dissipation device, comprising:
a first heat sink;
a second heat sink located on the first heat sink;
a third heat sink located on the second heat sink; and
a heat conducting member formed by bending a flat, plate-shaped member and connecting the first, second and third heat sinks, the heat conducting member comprising a heat absorbing section contacting the first heat sink and adapted for connecting with a heat-generating electronic component, and first and second heat dissipating sections extending inwards from two ends of the heat absorbing section, respectively, wherein the first heat dissipating section is sandwiched between the first and second heat sinks, the second heat dissipating section is sandwiched between the second and third heat sinks, a width of the first and second heat dissipating sections is identical to that of the second heat sink, and the first and second heat dissipating sections completely cover tops of the first and second heat sinks respectively.

9. The heat dissipation device as claimed in claim 8, wherein the flat, plate-shaped member is a copper plate.

10. The heat dissipation device as claimed in claim 8, wherein the flat, plate-shaped member is a vapor chamber with a work fluid filled therein.

11. The heat dissipation device as claimed in claim 8, wherein the heat conducting member further comprises comprising a first connecting section interconnecting the heat absorbing section and the first heat dissipating section and a second connecting section interconnecting the heat absorbing section and the second heat dissipating section.

12. The heat dissipation device as claimed in claim 11, wherein the heat absorbing section, the first and second connecting sections and the first and second heat dissipating sections are flat plates, the heat absorbing section is perpendicular relative to the first and second connecting sections respectively, the first connecting section is perpendicular relative to the first heat dissipating section, and the second connecting section is perpendicular relative to the second heat dissipating section.

* * * * *